United States Patent
Gotoh et al.

(10) Patent No.: US 6,514,352 B2
(45) Date of Patent: Feb. 4, 2003

(54) CLEANING METHOD USING AN OXIDIZING AGENT, CHELATING AGENT AND FLUORINE COMPOUND

(75) Inventors: Hideto Gotoh, Ibaraki (JP); Takayuki Niuya, Ibaraki (JP); Hiroyuki Mori, Yamanashi (JP); Hiroshi Matsunaga, Ibaraki (JP); Fukusaburo Ishihara, Saitama (JP); Yoshiya Kimura, Ibaraki (JP); Ryuji Sotoaka, Ibaraki (JP); Takuya Goto, Ibaraki (JP); Tetsuo Aoyama, Niigata (JP); Kojiro Abe, Niigata (JP)

(73) Assignees: Tokyo Electron Limited, Tokyo (JP); Mitsubishi Gas Chemical Company Inc., Tokyo (JP)

( * ) Notice: Subject to any disclaimer, the term of this patent is extended or adjusted under 35 U.S.C. 154(b) by 0 days.

(21) Appl. No.: 09/971,578

(22) Filed: Oct. 9, 2001

(65) Prior Publication Data
US 2002/0066465 A1 Jun. 6, 2002

(30) Foreign Application Priority Data

Oct. 10, 2000 (JP) ........................................ 2000-309172

(51) Int. Cl.⁷ ................................................ C23G 1/02
(52) U.S. Cl. ........................... 134/3; 134/2; 134/22.13; 134/22.14; 134/22.17; 134/22.19; 134/34; 134/36; 134/41; 134/902
(58) Field of Search .............................. 134/2, 3, 34, 36, 134/41, 902, 22.13, 22.14, 22.17, 22.19

(56) References Cited

U.S. PATENT DOCUMENTS

| | | | | |
|---|---|---|---|---|
| 4,410,396 A | * | 10/1983 | Somers et al. | 134/3 |
| 4,899,767 A | * | 2/1990 | McConnell et al. | 134/102.2 |
| 4,911,761 A | * | 3/1990 | McConnell et al. | 134/10 |
| 5,236,515 A | * | 8/1993 | Ueno et al. | 134/155 |
| 5,882,433 A | * | 3/1999 | Ueno | 134/31 |
| 5,934,566 A | * | 8/1999 | Kanno et al. | 134/102.1 |
| 6,030,932 A | * | 2/2000 | Leon et al. | 510/175 |
| 6,143,705 A | * | 11/2000 | Kakizawa et al. | 510/175 |
| 6,277,749 B1 | * | 8/2001 | Funabashi | 134/1.3 |
| 6,323,169 B1 | * | 11/2001 | Abe et al. | 510/175 |
| 2001/0054706 A1 | * | 12/2001 | Levert et al. | 252/79.1 |

FOREIGN PATENT DOCUMENTS

| EP | 1035446 A2 | * | 9/2000 |
|---|---|---|---|
| JP | 10159893 | * | 12/1999 |

* cited by examiner

Primary Examiner—Sharidan Carrillo
(74) Attorney, Agent, or Firm—Antonelli, Terry, Stout & Kraus, LLP

(57) ABSTRACT

The cleaning method described above is characterized by allowing a cleaning agent comprising an oxidizing agent, a chelating agent and fluorine compound to flow on a surface of a material to be treated at a high speed to thereby clean the above surface according to the present invention, deposits adhering firmly to a surface of a material to be treated can readily be removed without damaging the material to be treated.

18 Claims, 3 Drawing Sheets

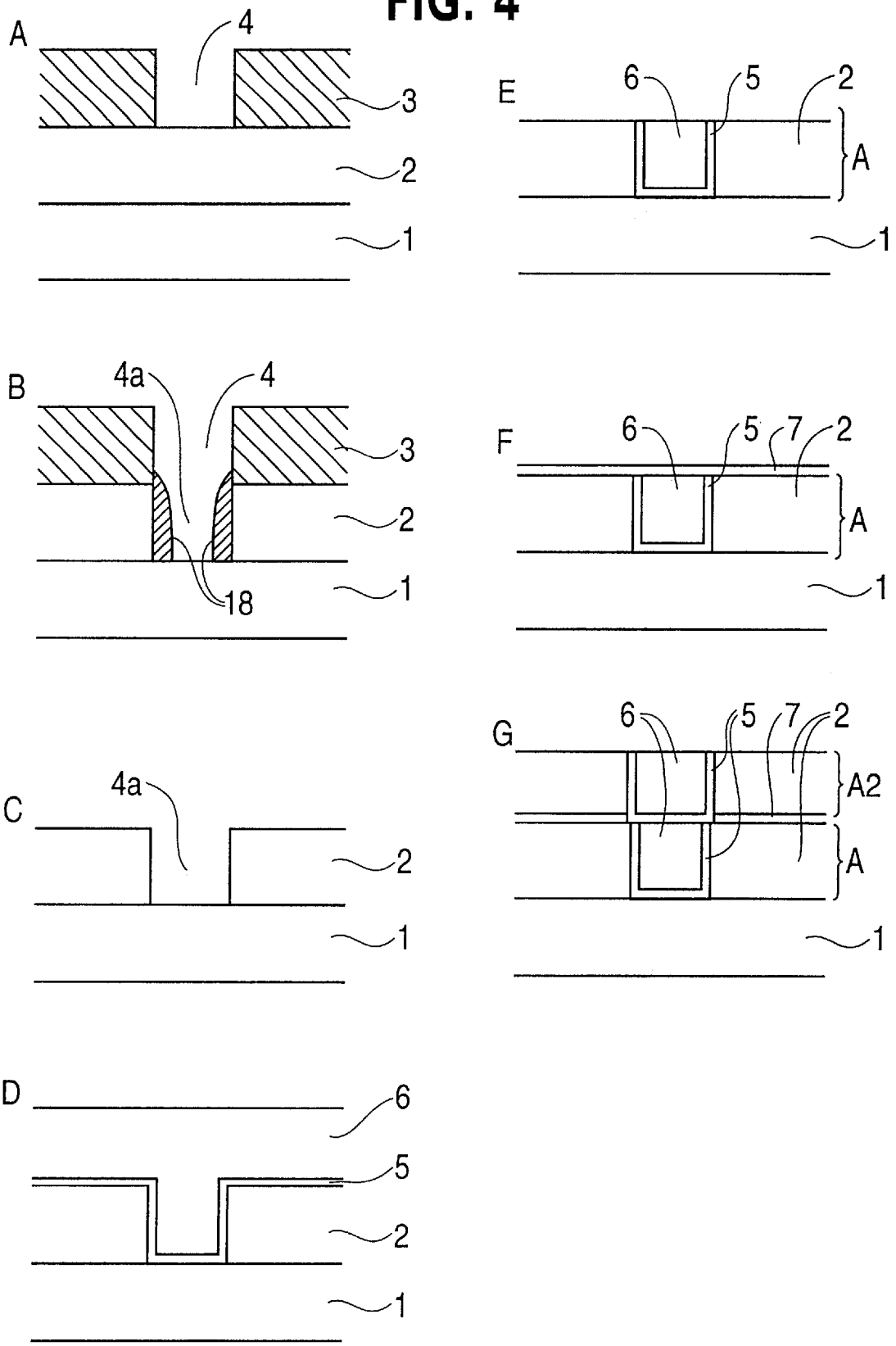

CLEANING METHOD USING AN OXIDIZING AGENT, CHELATING AGENT AND FLUORINE COMPOUND

BACKGROUND OF THE INVENTION

The present invention relates to a cleaning method for removing deposits on a surface of a material to be treated, specifically to a cleaning method for removing deposits adhering firmly to a surface of a material to be treated without damaging the material to be treated.

RELATED ART

When a surface of a material to be treated is cleaned with a cleaning agent, damage such as corrosion has been exerted on the surface of the material to be treated by too strong detergency in a certain case.

In these days, a lithography is one of indispensably important techniques as a production process for a highly integrated semiconductor device. When a semiconductor device is produced using lithography, formed on a substrate such as a silicon wafer are a conductive thin film of a metal film which is a conductive wiring material and an interlayer insulating thin film such as silicon oxide film having a purpose of providing insulation between wirings; then, a photoresist is applied evenly thereon to form a photosensitive layer; and this is subjected to selective exposure and developing treatment to form a desired resist pattern. Then, this photoresist pattern is used as a mask to subject a silicon oxide film on a lower part to selective etching treatment, whereby a desired pattern is formed on the above thin film. Then, the above photoresist pattern is completely removed to finish a series of steps.

In recent years, ultra high integration in a semiconductor device is advanced, and it has been required to form a pattern of quarter micron or less. As a dimension in such processing goes on toward ultra fineness, a dry etching method has come to be a main stream in selective etching treatment, and ashing carried out by oxygen plasma has come to be used for removing a resist pattern. This ashing means to remove a resist comprising, for example, an organic polymer in the form of CO and $CO_2$ by combustion reaction by virtue of oxygen plasma generated in plasma. It is known that when carrying out dry etching treatment, produced in a peripheral part of a pattern formed are a dry etching gas, a resist and a processed film and a residue (hereinafter referred to as an etching residue) originating in a processing chamber member in a dry etching apparatus. If such etching residue remains particularly in an inside of a via hole and a peripheral part thereof, an increase in a resistance of a semiconductor device is brought about or electric short circuiting is caused, and therefore it is not preferred.

Further, in recent years, a Damascene process is used as a production process for a highly integrated semiconductor device when a simple substance of copper is used for a wiring material. The fundamental Damascene process which is applied at present shall be explained below. As shown in FIG. 4, (a) a silicon oxide film 2 for providing insulation between wirings is formed on a silicon wafer 1 by a CVD method; a photoresist 3 is applied evenly on the surface thereof to form a photosensitive layer; and this is subjected to selective exposure and developing treatment to form a desired resist pattern 4. (b) This photoresist pattern 4 is used as a mask to subject the silicon oxide film 2 in a lower part to dry etching treatment, whereby a desired pattern 4a is formed. In this case, an etching residue 8 remains on the pattern 4a. (c) The photoresist 3 and the etching residue 8 are completely removed. (d) In order to inhibit copper from diffusing, a TaN (tantalum nitride) layer 5 is evenly formed in an inside of the pattern 4a on the silicon oxide film 2 by a PVD method, and then a copper thin film layer 6 which is a conductive wiring material is formed thereon by the PVD method or plating treatment. (e) The surplus films of copper and TaN which are not required are removed by a CMP method, and the copper thin film layer 6 is polished together with the silicon oxide film 2 to achieve flattening, whereby an initial wiring layer A is formed. (f) A silicon nitride film 7 is formed by a plasma CVD method in order to inhibit copper from diffusing between a wiring layer which is formed on an upper layer later and the initial wiring layer A described above. Then, (g) a wiring layer A2 is further formed on the initial wiring layer A by repeating the steps of (a) to (f), whereby a desired wiring layer is formed.

Organic amine base peeling solutions comprising a mixture of alkanolamine and an organic solvent are disclosed as a cleaning solution for removing an etching residue, a cured resist layer and a resist in such a production process for a semiconductor device in, for example, Japanese Patent Application Laid-Open No. 49355/1987 and Japanese Patent Application Laid-Open No. 42653/1989. However, when washing with water is carried out after removing an etching residue, a resist and the like, amines contained in these cleaning solutions are dissociated by virtue of moisture absorbed to show alkalinity, so that a metal film is corroded, and therefore involved therein is the problem that an organic solvent such as alcohol is required as a rinsing solution.

Further, fluorine base aqueous solutions comprising a fluorine compound, an organic solvent and a corrosion inhibitor are disclosed as a cleaning solution having a higher capacity for removing an etching residue, a cured resist layer and a resist than that of an organic amine base peeling solution in Japanese Patent Application Laid-Open No. 201794/1995 and Japanese Patent Application Laid-Open No. 67632//1999.

In recent years, however, processing conditions in dry etching in a production process for a semiconductor device become severe, and a resist surface layer is more changed in property, whereby a cured resist layer is formed, and it has become impossible to completely remove them with the organic amine base peeling solutions and the fluorine base aqueous solutions described in the respective official gazettes described above. Further, an etching residue which is left standing without removing brings about electrical troubles such as an increase in a resistance, breaking of wire and short or unusual circuiting, and therefore strongly desired is a cleaning solution which can completely remove the etching residue, the cured resist layer and the resist for forming a mask which is unnecessary after dry etching each described above. Also, ashing by the use of oxygen plasma can be used as well for removing a resist pattern which becomes unnecessary. This ashing means to remove a resist comprising, for example, an organic polymer in the form of CO and $CO_2$ by combustion reaction by virtue of oxygen plasma generated in plasma. However, in this ashing, that is, in a method for removing a photoresist by oxidation, copper is notably oxidized, and a low resistance which is a merit thereof is damaged. Accordingly, it is very important to remove a resist changed in property by etching without damaging a copper wiring material.

DISCLOSURE OF THE INVENTION

The present invention has been made in order to solve the problems described above, and an object thereof is to provide a cleaning method by which deposits adhering firmly to a surface of a material to be treated can readily be removed without damaging the material to be treated.

The present invention provides a cleaning method characterized by allowing a cleaning agent comprising an oxidizing agent, a chelating agent and a fluorine compound to flow on a surface of a material to be treated at a high speed to thereby clean the above surface to remove residues on the surface of the material to be treated on an inorganic substrate.

BRIEF DESCRIPTION OF THE DRAWINGS

FIG. 4 is a drawing showing steps for producing a semiconductor device by a Damascene process.

EMBODIMENT OF THE INVENTION

Figure 1:
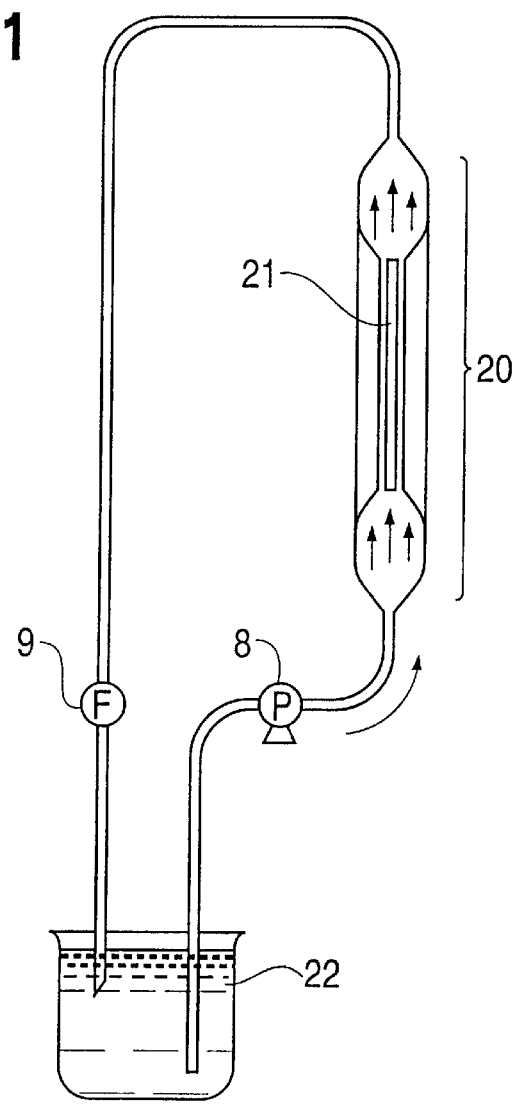
FIG. 1 is a drawing showing a dipping single layer type cleaning apparatus for cleaning a semiconductor device with a high speed stream.

In the cleaning method of the present invention, capable of being cleaned as objects thereof are various material to be treateds, for example, various parts including electronic parts such as semiconductor devices, liquid crystal display elements, photodisks, print substrates, plasma displays and field emission displays.

According to the cleaning method of the present invention, in removing a resist for forming a mask which is unnecessary after dry etching or after carrying out ashing after dry etching, a cured resist layer and an etching residue, cured resist layer and etching residue, used is a cleaning agent comprising an oxidizing agent, a chelating agent, a fluorine compound and, if necessary, an organic solvent to carry out cleaning with a high speed stream, whereby they can readily be peeled off for short time without corroding at all a wiring material and an insulating film. Further, an organic solvent such as alcohol does not have to be used as a rinsing solution, and rinsing can be carried out with only water.

The oxidizing agent used in the present invention includes, for example, inorganic oxidizing agent such as hydrogen peroxide, ozone, hypochlorous acid, and it is particularly preferably hydrogen peroxide. The oxidizing agent used in the present invention has a content of usually 0.0001 to 60% by weight, preferably 0.0005 to 30% by weight based on the cleaning agent. If the oxidizing agent has a content of less than 0.0001% by weight, the speed for removing the resist, the cured resist layer and the etching residue is reduced. On the other hand, if it exceeds 60% by weight, corrosion of the wiring material and the insulating layer is accelerated.

The chelating agent used in the present invention includes, for example, aminopolycarboxylic acids such as ethylenediaminetetraacetic acid (EDTA), hydroxyethylethylenediaminetetraacetic acid (DHEDDA), 1,3-propanediaminetetraacetic acid (1,3-PDTA), diethylenetriaminepentaacetic acid (DTDA), triethylenetetraaminehexaacetic acid (TTNA), nitrilotriacetic acid (NTA) and hydroxyethylimino-diacetic acid (HIMDA) or ammonium salts, metal salts and organic alkali salts thereof; phosphonic acid base chelating agents having at least one phosphonic acid group in a molecule such as methyldiphosphonic acid, aminotrismethylenephosphonic acid, ethylidene-diphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetetamethylenephosphonic acid or ammonium salts, organic amine salts and alkali metal salts thereof and oxides in which the compounds having a nitrogen atom in a molecule among these phosphonic acid base chelating agents are oxidized into N-oxides; and condensed phosphoric acids such as metaphosphoric acid, tetrametaphosphoric acid, hexametaphosphoric acid and tripolyphosphoric acid or ammonium salts, metal salts and organic amine salts thereof, dicarboxylic acids such as oxalic acid, maronic acid, succinic acid, dimercapto succinic acid, glutaric acid, maleic acid, phthalic acid, fumaric acid, polycarboxylic acids such as tricarbaryl acid, propane-1,1,2,3-tetracarboxylic acid, butane-1,2,3,4-tetracarboxylic acid, pyromellitic acid, oxycarboxylic acids such as glycolic acid, β-hydroxypropionic acid, citric acid, malic acid, tartaric acid, pyruvic acid, diglycol acid, salicylic acid, gallic acid, polyphenols such as catechol, pyrogallol, phosphoric acids such as pyrophosphoric acid, polyphosphoric acid, heterocyclic compounds such as 8-oxyquinoline, diketones such as α, α'-dipyridyl acetylacetone.

Among these chelating agents, included are dicarboxylic acids and the compounds having preferably two or more phosphonic acid groups, more preferably 2 to 6 phosphonic acid groups in a molecule. To be specific, preferred are oxalic acid, 1,2-propanediaminetetetamethylenephosphonic acid, diethylenetriaminepentamethylenephosphonic acid and ethylenediaminetetrakismethylenephosphonic acid, and oxalic acid and 1,2-propanediaminetetetamethylenephosphonic acid are particularly preferred. The chelating agents described above can be used alone or in combination of two or more kinds thereof.

This chelating agent has a content of usually 0.01 to 10% by weight, preferably 0.05 to 5% by weight and more preferably 0.1 to 3% by weight based on the cleaning agent. If the chelating agent has a content of less than 0.01% by weight, the effect for preventing metal impurities from readhering is scarcely observed. On the other hand, even if it exceeds 10% by weight, the addition effect is not elevated still more.

The fluorine compound used in the present invention includes, for example, organic amine fluorides such as ammonium fluoride, acidic ammonium fluoride, monoethanolamine fluoride, methylamine hydrogenfluoride, ethylamine hydrogenfluoride and propylamine hydrogenfluoride, tetramethylammonium fluoride and tetraethylammonium fluoride. Ammonium fluoride and tetramethylammonium fluoride are preferred. These fluorine compounds have a content of usually 0.001 to 20% by weight, preferably 0.005 to 10% by weight based on the cleaning agent. If the fluorine compound has a content of less than 0.001% by weight, the speed for removing the resist, the cured resist layer and the etching residue is reduced. On the other hand, if it exceeds 20% by weight, corrosion of the wiring material and the insulating layer is accelerated.

The cleaning agent used in the present invention may contain, if necessary, an organic solvent, and it includes, for example, ether base solvents such as ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether and dipropylene glycol dimethyl ether; amide base solvents such as formamide, monomethyl-formamide, dimethylformamide, monoethylformamide, diethylformamide, acetamide, monomethylacetamide, N-methylpyrrolidone, N-ethylpyrrolidone, N,N-dimethylformamide and N,N-dimethylacetamide; and sulfur compound base solvents such as dimethylsulfoxide, dimethylsulfone, diethylsulfone, bis(2-hydroxysulfone) and tetramethylenesulfone.

Among them, preferably used. are dimethylsulfoxide, N,N-dimethylformamide, N,N-dimethylacetamide, N-methylpyrrolidone, diethylene glycol monomethyl ether, diethylene glycol monobutyl ether, dipropylene glycol monomethyl ether and dipropylene glycol monobutyl ether. The organic solvents described above can be used alone or in combination of two or more kinds thereof. The organic solvents described above have a content of usually 1 to 70% by weight based on the cleaning agent, and use and a content of the organic solvent may be determined according to the conditions in dry etching and/or ashing.

The cleaning agent used in the present invention may be blended, if necessary, with additives which have so far been used for a resist peeling solution as long as the object of the present invention is not damaged.

Further, a surfactant may be added in order to elevate a wetting property of the cleaning solution, and any of cationic, nonionic and anionic surfactants can be used.

A pH of this cleaning solution shall not specifically be restricted, and it is usually used in a range of pH 3 to 12. It can be selected according to the etching conditions and the kind of a semiconductor substrate. When it is used in an alkaline condition, ammonia, amine and quaternary ammonium hydroxides such as tetramethylammonium hydroxide may be added, and when it is used in an acidic condition, organic acids and inorganic acids may be added.

A temperature in carrying out the cleaning method of the present invention falls preferably in a range of usually a room temperature to 80° C. and can suitably be selected according to the etching conditions and the semiconductor substrate used.

As far as an environment in using the cleaning agent according to the present invention is concerned, the good effects can be obtained in a closed space which is as narrow as possible, for example, a space in which a volume of less than 1 liter can be secured, preferably a space which has a volume of less than 200 milliliter and in which a liquid flow amount of 1 liter/second or more, preferably 15 liter/second or more can be secured.

That is, in the cleaning method of the present invention, the residues on the surface of the material to be treated on the inorganic substrate are removed with high speed stream at a flow speed of preferably 3 to 1000 cm/second, particularly preferably 5 to 100 cm/second and more preferably 5 to 10 cm/second.

As described above, the cleaning agent having a detergency which is not too strong is used in the present invention to carry out high speed stream cleaning, whereby the resist, the cured resist layer and the etching residue can readily be peeled off for short time without corroding at all the wiring material and the insulating layer.

A dipping single layer type cleaning apparatus shown in, for example, FIG. 1 is used as a cleaning apparatus in which such high speed stream cleaning can be carried out. In this cleaning apparatus, a tube in which a semiconductor device 21 (a material to be cleaned) is disposed is narrowed in a closed type processing bath 20, whereby a flow speed of a cleaning solution 22 circulated by means of a pump 8 is accelerated to clean the material to be cleaned.

The semiconductor substrate which is used in the cleaning method of the present invention includes, for example, organic materials such as polyimides and acryl resins, semiconductor wiring materials such as silicon, amorphous silicon, polysilicon, a silicon oxide film, a silicon nitride film, copper, titanium, titanium-tungsten, titanium nitride, tungs ten, tantalum, tantalum compounds, chromium, chromium oxide and chromium alloys and compound semiconductors such as gallium-arsenic, gallium-phosphorus and indium-phosphorus.

An organic solvent such as alcohol does not have to be used for rinsing after removing the resist, the cured resist layer and the etching residue on the semiconductor substrate by the cleaning method of the present invention, and it is enough to carry out rinsing only with water.

Further, if the residues on the surface of the material to be treated on the inorganic substrate are cleaned with high speed stream by means of a cleaning agent comprising a surfactant and an organic solvent as pre-cleaning before or as after-cleaning after carrying out the cleaning method of the present invention to remove the residues on the surface of the material to be treated, the cleaning effect shall further be elevated.

In this case, the flow speed in high speed stream cleaning is preferably 3 to 1000 cm/second, particularly preferably 5 to 100 cm/second and further preferably 5 to 10 cm/second. The dipping single layer type cleaning apparatus described above shown in FIG. 1 can be used as a cleaning apparatus for carrying out this precleaning.

The cleaning agent used for pre-cleaning or after-cleaning comprises preferably 0.01 to 20% by weight of the surfactant and 80 to 99.9% by weight of the organic solvent. If the surfactant accounts for less than 0.01% by weight, the cleaning agent is short of a detergency, which makes it impossible to remove the residual photoresist for short time and to obtain the cleaning effect. On the other hand, if it exceeds 20% by weight, as the wirings and the insulating film are likely to be corroded.

The surfactant used for the cleaning agent in pre-cleaning or after-cleaning includes surfactants of a cation base, a nonion base, an anion base and a fluorine base, and particularly preferred is an anionic phosphoric acid ester base surfactant represented by the following formula:

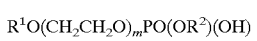

$$R^1O(CH_2CH_2O)_m PO(OR^2)(OH)$$

wherein $R^1$ represents an alkyl group or an alkylaryl group; $R^2$ represents H or a $R^3O(CH_2CH_2O)_n$ group; $R^3$ represents an alkyl group or an alkylaryl group, and $R^1$ and $R^3$ may the same or different; and m and n represent integers. Commercially available are, for example, Plysurfe A207H and A217C (brand names, manufactured by Daiichi Kogyo Seiyaku Co., Ltd.).

The surfactants can be used alone or in combination of two or more kinds thereof and may be an anionic surfactant or a mixture of an anionic surfactant and a nonionic surfactant.

The organic solvent used for the cleaning agent in pre-cleaning or after-cleaning includes, for example, ether base solvents such as ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether and dipropylene glycol dimethyl ether; amide base solvents such as formamide, monomethylformamide, dimethylformamide, monoethylformamide, diethyl-formamide, acetamide, monomethylacetamide, N-methylpyrrolidone, N-ethylpyrrolidone, N,N-dimethyl-formamide and N,N-dimethylacetamide; sulfur compound base solvents such as dimethylsulfoxide, dimethyl-sulfone, diethylsulfone, bis(2-hydroxysulfone) and tetramethylenesulfone; and alcohol base solvents such as methanol, ethanol, 1-propanol, 2-propanol, 1-hexanol, 1-nonanol, cyclohexanol and benzyl alcohol.

Among them, preferred are dimethylsulfoxide, N,N-dimethylformamide, N,N-dimethylacetamide, N-methylpyrrolidone, diethylene glycol monomethyl ether, diethylene glycol monobutyl ether, methanol and benzyl alcohol. Dimethylsulfoxide and N,N-dimethylforamide are more preferred. The organic solvents described above can be used alone or in combination of two or more kinds thereof and may be selected according to the conditions in dry etching and/or ashing.

The temperature in carrying out pre-cleaning or after cleaning shall not specifically be restricted and falls usually in a range of a room temperature to 90° C. It can suitably be selected according to the etching conditions and the inorganic substrate used.

As explained above in details, cleaning of a material to be treated by the cleaning method of the present invention makes it unnecessary to use an organic solvent such as alcohol as a rinsing solution and makes it possible to rinse it with only water, and deposits adhering firmly to the surface of the material to be treated can readily be removed without damaging the material to be treated.

The present invention shall more specifically be explained with reference to examples and comparative examples, but the present invention shall by no means be restricted by these examples. Examples 1 to 18 and Comparative Examples 1 to 18

Figure 3:
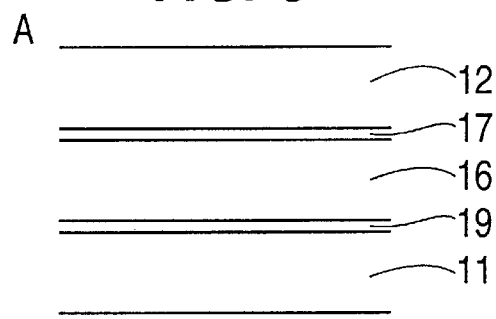
FIG. 3 represents drawings showing production steps for the semiconductor devices used in the examples and the comparative examples and a semiconductor device after cleaning.
Figure 3:
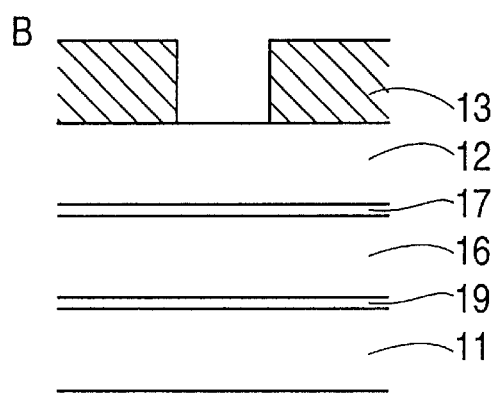
Figure 3:
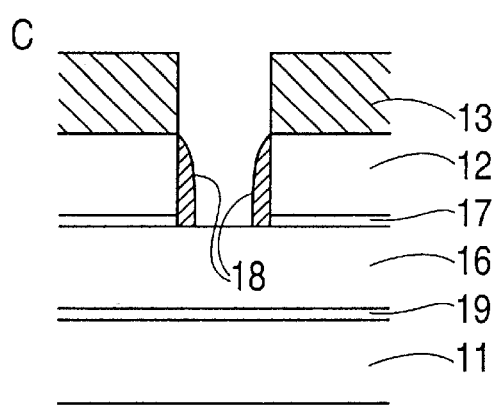
Figure 3:
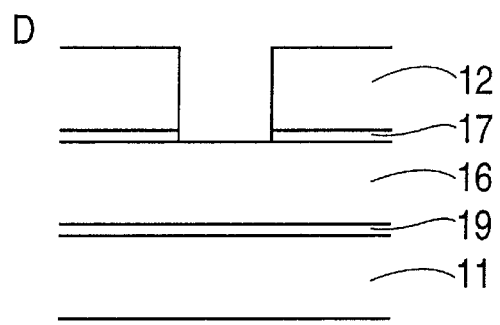

The samples of semiconductor devices were produced in the following manner. As shown in FIG. 3, (A) deposited in order on a silicon substrate 11 were a TiN layer 19 and a copper thin film layer 16 by a PVD method and a silicon nitride film 17 and a silicon oxide film 12 by a CVD method, and then (B) a photoresist layer 13 is coated thereon to process the resist by means of a conventional photo technique, whereby a desired mask pattern was formed. (C) A dry etching technique was used to subject the silicon oxide film 12 and the silicon nitride film 17 to dry etching through the desired mask pattern. Etching residues 18 remained on side walls of the silicon oxide film 12 and the silicon nitride film 17. Further, a surface layer of the photoresist layer 13 stayed in the state that it was cured by dry etching.

Figure 2:
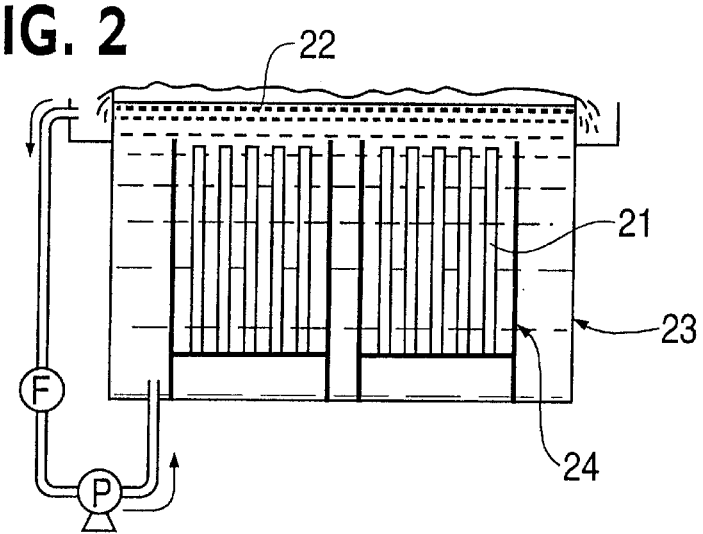
FIG. 2 is a drawing showing a dipping batch type cleaning apparatus for cleaning a semiconductor device.

Cleaning agents having compositions shown in Tables 1 and 2 were used to clean the semiconductor devices described above in cleaning conditions shown in Tables 1 and 2, wherein a dipping batch type cleaning apparatus (refer to FIG. 2) having a relatively slow flow speed was used in the case of Examples 1 to 6 and Comparative Examples 1 to 6, and a dipping single layer type cleaning apparatus (refer to FIG. 1) having a high flow speed was used in the case of Examples 7 to 18 and Comparative Examples 7 to 18.

After cleaning, the semiconductor devices were rinsed with ultra purified water and dried. Then, the surface states thereof were observed under an optical microscope and a scanning electron microscope (SEM) to evaluate a peeling state of the resists and the etching residues and a corrosion state of the copper wirings according to the following judging criteria. The results thereof are shown in Tables 1 and 2.

Peeling State: ⊚: completely removed ○: almost completely removed Δ: partially remained X: remained in large part Corrosion State: ⊚: corrosion was not observed at all ○: corrosion was scarcely observed Δ: corrosion was observed in a crater form or a pit form X: the whole surface of the copper layer was roughened, and corrosion of the copper layer was observed

TABLE 1

| | Composition of cleaning agent | | | | | | | | |
|---|---|---|---|---|---|---|---|---|---|
| | Oxidizing agent | | Chelating agent | | Fluorine compound | | Organic solvent | | Water |
| Example | Kind | Content (wt %) | Kind | Content (wt %) | Kind | Content (wt %) | Kind | Content (wt %) | Content (wt %) |
| 1 | HP | 5 | PDTP | 0.2 | TAF | 7 | — | — | Balance |
| 2 | HP | 5 | EDTP | 0.2 | TAF | 7 | — | — | Balance |
| 3 | HP | 5 | DTPP | 0.2 | TAF | 7 | — | — | Balance |
| 4 | HP | 5 | PDTP | 0.2 | AF | 0.2 | — | — | Balance |
| 5 | HP | 7 | PDTP | 0.2 | TAF | 5 | DMA | 45 | Balance |
| 6 | HP | 7 | PDTP | 0.2 | TAF | 5 | DMF | 45 | Balance |
| 7 | HP | 5 | PDTP | 0.2 | TAF | 7 | — | — | Balance |
| 8 | HP | 5 | EDTP | 0.2 | TAF | 7 | — | — | Balance |
| 9 | HP | 5 | DTPP | 0.2 | TAF | 7 | — | — | Balance |
| 10 | HP | 5 | PDTP | 0.2 | AF | 0.2 | — | — | Balance |
| 11 | HP | 7 | PDTP | 0.2 | TAF | 5 | DMA | 45 | Balance |
| 12 | HP | 7 | PDTP | 0.2 | TAF | 5 | DMF | 45 | Balance |
| 13 | HP | 5 | PDTP | 0.2 | TAF | 7 | — | — | Balance |
| 14 | HP | 5 | EDTP | 0.2 | TAF | 7 | — | — | Balance |
| 15 | HP | 5 | DTPP | 0.2 | TAF | 7 | — | — | Balance |
| 16 | HP | 5 | PDTP | 0.2 | AF | 0.2 | — | — | Balance |

TABLE 1-continued

| | | | | | | | | | |
|---|---|---|---|---|---|---|---|---|---|
| 17 | HP | 7 | PDTP | 0.2 | TAF | 5 | DMA | 45 | Balance |
| 18 | HP | 7 | PDTP | 0.2 | TAF | 5 | DMF | 45 | Balance |

| Example | Cleaning condition | | | Peeling state | | Corrosion state of copper |
|---|---|---|---|---|---|---|
| | Temperature (° C.) | Time (minute) | Solution flow speed (cm/second) | Resist | Etching residue | |
| 1 | 70 | 10 | 2 | ○ | Δ | ◎ |
| 2 | 70 | 10 | 2 | ○ | Δ | ◎ |
| 3 | 70 | 10 | 2 | ○ | Δ | ◎ |
| 4 | 23 | 15 | 2 | ○ | Δ | ◎ |
| 5 | 70 | 10 | 2 | ○ | Δ | ◎ |
| 6 | 70 | 10 | 2 | ○ | Δ | ◎ |
| 7 | 70 | 10 | 5 | ○ | ○ | ◎ |
| 8 | 70 | 10 | 5 | ○ | ○ | ◎ |
| 9 | 70 | 10 | 5 | ○ | ○ | ◎ |
| 10 | 23 | 15 | 5 | ○ | ○ | ◎ |
| 11 | 70 | 10 | 5 | ○ | ○ | ◎ |
| 12 | 70 | 10 | 5 | ○ | ○ | ◎ |
| 13 | 70 | 10 | 10 | ◎ | ◎ | ◎ |
| 14 | 70 | 10 | 10 | ◎ | ◎ | ◎ |
| 15 | 70 | 10 | 10 | ◎ | ◎ | ◎ |
| 16 | 23 | 15 | 10 | ◎ | ◎ | ◎ |
| 17 | 70 | 10 | 10 | ◎ | ◎ | ◎ |
| 18 | 70 | 10 | 10 | ◎ | ◎ | ◎ |

HP: Hydrogen peroxide
PDTP: 1,2-propanediaminetetramethylenephosphonic acid
EDTP: ethylenediaminetetrakismethylenephosphonic acid
DTPP: diethylenetriaminepentamethylenephosphonic acid
TAF: tetramethylammonium fluoride
AF: ammonium fluoride
DMA: dimethylacetamide
DMF: dimethylformamide

TABLE 2

| Comparative Example | Composition of cleaning agent | | | | | | | | Water |
|---|---|---|---|---|---|---|---|---|---|
| | Oxidizing agent | | Chelating agent | | Fluorine compound | | Organic solvent | | |
| | Kind | Content (wt %) | Kind | Content (wt %) | Kind | Content (wt %) | Kind | Content (wt %) | Content (wt %) |
| 1 | HP | 5 | — | — | — | — | — | — | Balance |
| 2 | — | — | PDTP | 0.2 | — | — | — | — | Balance |
| 3 | — | — | — | — | TAF | 7 | — | — | Balance |
| 4 | — | — | — | — | — | — | DMA | 45 | Balance |
| 5 | HP | 5 | PDTP | 0.2 | — | — | — | — | Balance |
| 6 | HP | 5 | — | — | TAF | 7 | — | — | Balance |
| 7 | HP | 5 | — | — | — | — | — | — | Balance |
| 8 | — | — | PDTP | 0.2 | — | — | — | — | Balance |
| 9 | — | — | — | — | TAF | 7 | — | — | Balance |
| 10 | — | — | — | — | — | — | DMA | 45 | Balance |
| 11 | HP | 5 | PDTP | 0.2 | — | — | — | — | Balance |
| 12 | HP | 5 | — | — | TAF | 7 | — | — | Balance |
| 13 | HP | 5 | — | — | — | — | — | — | Balance |
| 14 | — | — | PDTP | 0.2 | — | — | — | — | Balance |
| 15 | — | — | — | — | TAF | 7 | — | — | Balance |
| 16 | — | — | — | — | — | — | DMA | 45 | Balance |
| 17 | HP | 5 | PDTP | 0.2 | — | — | — | — | Balance |
| 18 | HP | 5 | — | — | TAF | 7 | — | — | Balance |

| Comparative Example | Cleaning condition | | | Peeling state | | Corrosion state of copper |
|---|---|---|---|---|---|---|
| | Temperature (° C.) | Time (minute) | Solution flow speed (cm/second) | Resist | Etching residue | |
| 1 | 70 | 10 | 2 | X | X | ◎ |
| 2 | 70 | 10 | 2 | X | X | ○ |
| 3 | 70 | 10 | 2 | X | X | Δ |
| 4 | 70 | 10 | 2 | X | X | ○ |
| 5 | 70 | 10 | 2 | X | Δ | ◎ |
| 6 | 70 | 10 | 2 | Δ | X | X |
| 7 | 70 | 10 | 5 | X | X | ○ |
| 8 | 70 | 10 | 5 | X | X | Δ |

TABLE 2-continued

| 9  | 70 | 10 | 5  | Δ | X | X |
| 10 | 70 | 10 | 5  | X | X | ○ |
| 11 | 70 | 10 | 5  | X | ○ | ⊙ |
| 12 | 70 | 10 | 5  | ○ | X | X |
| 13 | 70 | 10 | 10 | X | X | ⊙ |
| 14 | 70 | 10 | 10 | X | Δ | ○ |
| 15 | 70 | 10 | 10 | ○ | X | ○ |
| 16 | 70 | 10 | 10 | Δ | X | ⊙ |
| 17 | 70 | 10 | 10 | X | ⊙ | ○ |
| 18 | 70 | 10 | 10 | ⊙ | X | Δ |

HP: Hydrogen peroxide
PDTP: 1,2-propanediaminetetramethylenephosphonic acid
TAF: tetramethylammonium fluoride
DMA: dimethylacetamide As shown in Table 1, in Examples 1 to 18 to which the cleaning method of the present invention was applied, copper was not corroded at all, and the peeling state was excellent. As shown in FIG. 3(D), both the resist and the etching residues including the cured surface layer were completely removed particularly in Examples 13 to 18 in which cleaning was carried out with a high speed stream.

EXAMPLE 19

In the step of producing the sample of the semiconductor device, ashing was further carried out by oxygen plasma after the step (C) to remove the resist. Etching residues on the resulting semiconductor device which were produced in dry etching were cleaned with the cleaning agent having the same composition as in Example 7 on the conditions of a cleaning temperature of 70° C., a cleaning time of 10 minutes and a solution flow speed of 10 cm/second, rinsed with ultra purified water and then dried.

Then, a peeling state of the etching residues and a corrosion state of the copper wirings were evaluated in the same manners as in Example 1. As a result thereof, it was found that the etching residues were completely removed and that the corrosion of copper was not observed at all.

What is claimed is:

1. A cleaning method for cleaning electronic parts, comprising:
    (a) providing a cleaning composition comprising an oxidizing agent, a chelating agent and a fluorine compound in a cleaning bath;
    (b) providing a tube having a first part and a second part, said second part being adjacent to said first part and having a narrowed region narrower in width than that of said first part;
    (c) dipping the tube in the cleaning bath containing said cleaning composition such that the cleaning composition passes from the cleaning bath through the first part and then through the narrowed region;
    (d) positioning a part in the narrowed region;
    (e) circulating the cleaning composition from said cleaning bath through the tube; and
    (f) flowing the cleaning composition through the tube at a flow speed of 3–1000 cm/sec through the narrowed region to clean a surface of the part.

2. The cleaning method as described in claim 1, wherein said electronic parts are a semiconductor device or a liquid crystal display element.

3. The cleaning method as described in claim 1, wherein the cleaning composition comprises 0.0001 to 60% by weight of the oxidizing agent, 0.01 to 10% by weight of the chelating agent and 0.01 to 20% by weight of the fluorine compound.

4. The cleaning method as described in claim 1, wherein the cleaning composition further comprises 1 to 70% by weight of an organic solvent.

5. The cleaning method as described in claim 1, wherein the cleaning composition further comprises a surfactant.

6. The cleaning method as described in claim 1, wherein said flow speed is in a range of 5 to 100 cm/second.

7. The cleaning method as described in claim 1, wherein said flow speed is in a range of 5 to 10 cm/second.

8. The cleaning method as described in claim 1, wherein said electronic parts are selected from the group consisting of semiconductor devices, liquid crystal elements, photodisks, print substrates, plasma displays and field emission displays.

9. The cleaning method as described in claim 1, wherein said oxidizing agent is selected from the group consisting of hydrogen peroxide, ozone and hypochlorous acid; said chelating agent is selected from the group consisting of oxalic acid, 1,2-propanediaminetetramethylenephosphonic acid, diethylenetriaminepentamethylenephosphonic acid and ethylenediaminetetrakismethylenephosphonic acid; and said fluorine compound is selected from the group consisting of ammoniun fluoride and tetramethylammonium fluoride.

10. The cleaning method as described in claim 1, further comprising at least one of a pre-treatment before allowing said cleaning composition to flow on the surface of the electronic parts, and a post-treatment after allowing said cleaning composition to flow on the surface of the electronic parts, the pre-treatment and the post-treatment each comprising contacting the surface of the electronic parts with a further cleaning composition having a surfactant and an organic solvent.

11. The cleaning method as described in claim 9, wherein said oxidizing agent is hydrogen peroxide, and said chelating agent is selected from the group consisting of oxalic acid and 1,2-propanediaminetetramethylenephosphonic acid.

12. A cleaning method for cleaning parts, comprising:
    (a) providing a cleaning composition comprising an oxidizing agent, a chelating agent and a fluorine compound in a cleaning bath;
    (b) providing a tube having a first part and a second part, said second part being adjacent to said first part and having a narrowed region narrower in width than that of said first part;
    (c) dipping the tube in the cleaning bath containing said cleaning composition such that the cleaning composition passes from the cleaning bath through the first part and then through the narrowed region;
    (d) positioning a part in the narrowed region;
    (e) circulating the cleaning composition from said cleaning bath through the tube; and (f) flowing the cleaning composition through the tube at a flow speed of 3–1000 cm/sec through the narrowed region to clean a surface of the part.

13. The cleaning method as described in claim 12, wherein said part includes deposits to be removed from the part by the cleaning composition, and wherein said deposits include a deposit formed after dry etching the part.

14. The cleaning method as described in claim 12 wherein the part includes deposits to be removed from the part by the cleaning composition, and wherein said deposits including a remaining portion of resist.

15. The cleaning method as described in claim 12, wherein the cleaning composition comprises 0.0001 to 60% by weight of the oxidizing agent, 0.01 to 10% by weight of the chelating agent and 0.01 to 20% by weight of the fluorine compound.

16. The cleaning method as described in claim 12, wherein the cleaning composition further comprises 1 to 70% by weight of an organic solvent.

17. The cleaning method as described in claim 12, wherein the cleaning composition further comprises a surfactant.

18. The cleaning method as described in claim 14, wherein said remaining portion of the resist is a remainder after ashing treatment of the resist.

\* \* \* \* \*